United States Patent
Lacey et al.

(10) Patent No.: US 9,991,431 B2
(45) Date of Patent: Jun. 5, 2018

(54) OPTOELECTRONIC COMPONENT AND METHOD OF PRODUCING SAME

(71) Applicant: OSRAM Opto Semiconductors GmbH, Regensburg (DE)

(72) Inventors: David John Lacey, Tanjung Tokong (MY); Abdul Manaf Shahrol Izzani, Georgetown (MY)

(73) Assignee: OSRAM Opto Semiconductors GmbH (DE)

( * ) Notice: Subject to any disclaimer, the term of this patent is extended or adjusted under 35 U.S.C. 154(b) by 0 days. days.

(21) Appl. No.: 15/326,191

(22) PCT Filed: Jul. 14, 2015

(86) PCT No.: PCT/EP2015/066080
§ 371 (c)(1),
(2) Date: Jan. 13, 2017

(87) PCT Pub. No.: WO2016/008892
PCT Pub. Date: Jan. 21, 2016

(65) Prior Publication Data
US 2017/0200875 A1 Jul. 13, 2017

(30) Foreign Application Priority Data
Jul. 17, 2014 (DE) .................... 10 2014 110 067

(51) Int. Cl.
*H01L 33/62* (2010.01)
*H01L 33/60* (2010.01)
(Continued)

(52) U.S. Cl.
CPC ............. *H01L 33/62* (2013.01); *H01L 33/60* (2013.01); *H05K 1/028* (2013.01); *H05K 1/118* (2013.01);
(Continued)

(58) Field of Classification Search
USPC .......................................... 257/98
See application file for complete search history.

(56) References Cited

U.S. PATENT DOCUMENTS 8,791,490 B2 * 7/2014 Lang .................. H01L 51/5203
257/99
2002/0088987 A1 * 7/2002 Sakurai ............ H01L 27/14618
257/99
(Continued)

FOREIGN PATENT DOCUMENTS

DE    10 2007 021 078 A1    11/2008
DE    10 2007 057 240 A1    6/2009
(Continued)

*Primary Examiner* — Marcos D Pizarro
*Assistant Examiner* — Lawrence Tynes, Jr.
(74) *Attorney, Agent, or Firm* — DLA Piper LLP (US)

(57) ABSTRACT

An optoelectronic component includes a carrier strip and an optoelectronic semiconductor chip, a first electrical connection surface formed on a front side of the chip and a second electrical connection surface is formed on a rear side of the chip, first and second electrically conductive contact regions are formed on the strip, the first region is arranged on a folding section of the strip, the rear side of the chip faces toward an upper side of the strip, the upper side faces toward the front side of the chip, the first electrical connection surface electrically conductively connects to the first region, the second electrical connection surface electrically conductively connects to the second region by a second connecting material, the strip has a second through-opening that lies next to the second region, and the second connecting material extends through the second contact opening to a lower side of the strip.

16 Claims, 4 Drawing Sheets

(51) Int. Cl.
  *H05K 1/18* (2006.01)
  *H05K 1/02* (2006.01)
  *H05K 1/11* (2006.01)
  *H05K 3/32* (2006.01)

(52) U.S. Cl.
  CPC ................ *H05K 1/18* (2013.01); *H05K 3/32* (2013.01); *H01L 2933/0066* (2013.01)

(56) References Cited

U.S. PATENT DOCUMENTS

| | | | | |
|---|---|---|---|---|
| 2007/0096272 A1* | 5/2007 | Wang | .................... | H01L 33/483 257/675 |
| 2007/0210400 A1* | 9/2007 | Moribayashi | ........ | G02B 6/4214 257/440 |
| 2008/0117324 A1* | 5/2008 | Minamio | ............. | H04N 5/2253 348/340 |
| 2008/0284308 A1* | 11/2008 | Pang | .................... | G02B 6/0083 313/498 |
| 2011/0019433 A1* | 1/2011 | Dussault | .................. | F21S 4/24 362/555 |
| 2011/0079802 A1* | 4/2011 | Ng | .......................... | H01L 33/62 257/98 |
| 2011/0291302 A1* | 12/2011 | Mueller | .................. | H01L 24/29 257/783 |
| 2015/0201492 A1* | 7/2015 | Kim | ...................... | H05K 1/028 361/749 |
| 2017/0200875 A1* | 7/2017 | Lacey | .................... | H01L 33/62 |

FOREIGN PATENT DOCUMENTS

| | | |
|---|---|---|
| DE | 10 2008 051 256 A1 | 4/2010 |
| DE | 10 2008 062 211 A1 | 6/2010 |
| DE | 10 2010 031 302 A1 | 1/2012 |
| DE | 10 2012 101 463 A1 | 8/2013 |
| EP | 1 732 132 A1 | 12/2006 |

* cited by examiner

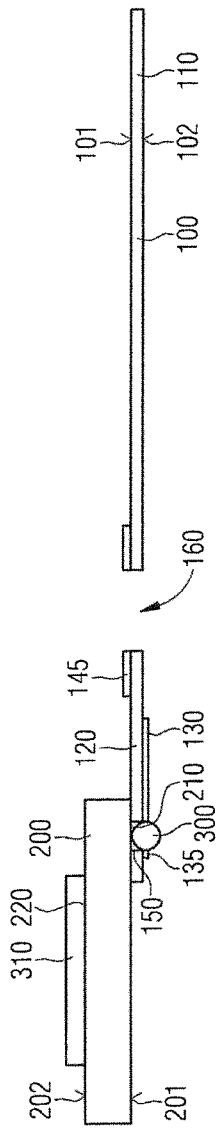
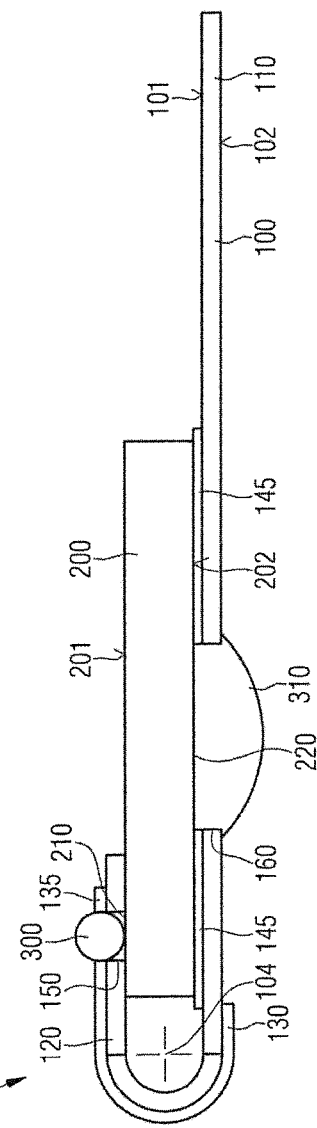

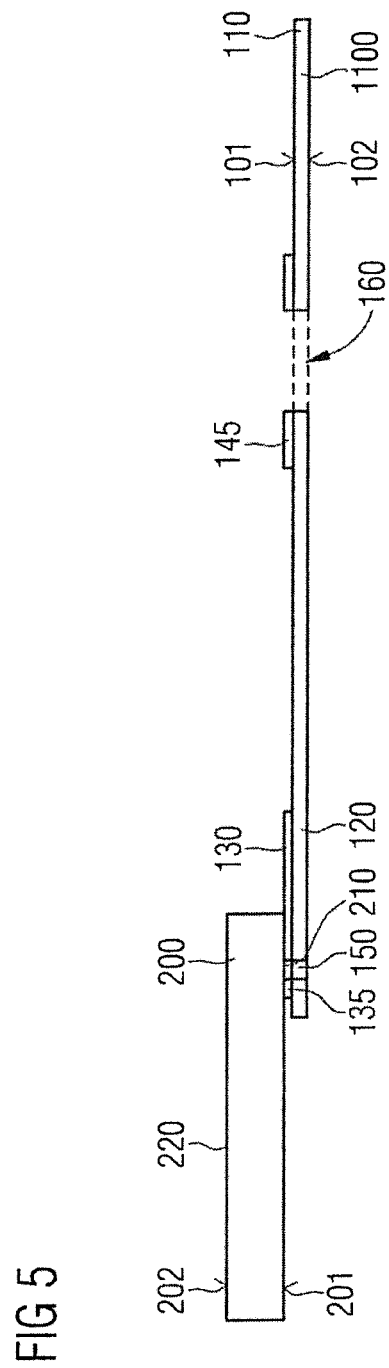

OPTOELECTRONIC COMPONENT AND METHOD OF PRODUCING SAME

TECHNICAL FIELD

This disclosure relates to an optoelectronic component and a method of producing an optoelectronic component.

BACKGROUND

Optoelectronic components in which optoelectronic semiconductor chips, for example, light-emitting diode chips are arranged on flexible strip-shaped carriers, are known. Such optoelectronic components are used, for example, to make signs and for illumination. During production of such optoelectronic components, light-emitting diode chips are soldered onto carrier strips, which to this end must have a high heat resistance, which entails high costs.

SUMMARY

We provide an optoelectronic component including a flexible carrier strip and an optoelectronic semiconductor chip, wherein a first electrical connection surface is formed on a front side of the optoelectronic semiconductor chip and a second electrical connection surface is formed on a rear side of the optoelectronic semiconductor chip, an electrically conductive first contact region and an electrically conductive second contract region are formed on the carrier strip, the first contact region is arranged on a folding section of the carrier strip, the rear side of the optoelectronic semiconductor chip faces toward an upper side of the carrier strip, the upper side of the folding section of the carrier strip faces toward the front side of the optoelectronic semiconductor chip, the first electrical connection surface electrically conductively connects to the first contact region, the second electrical connection surface electrically conductively connect to the second contact region by a second connecting material, the carrier strip has a second through-opening that lies next to the second contact region, and the second connecting material extends through the second contact opening to a lower side of the carrier strip.

We also provide a method of producing an optoelectronic component including providing an optoelectronic semiconductor chip having a first electrical connection surface formed on a front side and a second electrical connection surface formed on a rear side, providing a flexible carrier strip having an electrically conductive first contact region and an electrically conductive second contact region, wherein the first contact region is arranged on a folding section of the carrier strip, and a second through-opening of the flexible carrier strip lies next to the second contact region; arranging the optoelectronic semiconductor chip such that the front side of the optoelectronic semiconductor chip faces toward an upper side of the folding section of the carrier strip and the first contact region is aligned with the first electrical connection surface; producing an electrically conductive connection between the first electrical connection surface and the first contact region; and bending the folding section to cause the rear side of the optoelectronic semiconductor chip to face toward the upper side of the carrier strip and electrically conductively connect the second electrical connection surface to the second contact region, wherein the second electrical connection surface electrically conductively connects to the second contact region by a second connecting material such that the second connecting material is at least partially pressed through the second through-opening.

BRIEF DESCRIPTION OF THE DRAWINGS

FIG. 2 shows a sectional side view of the carrier strip and of the optoelectronic semiconductor chip.

FIG. 3 shows a further sectional side view of the carrier strip and of the optoelectronic semiconductor chip in a subsequent processing state.

FIG. 5 shows a sectional side view of a further carrier strip.

Figure 1:
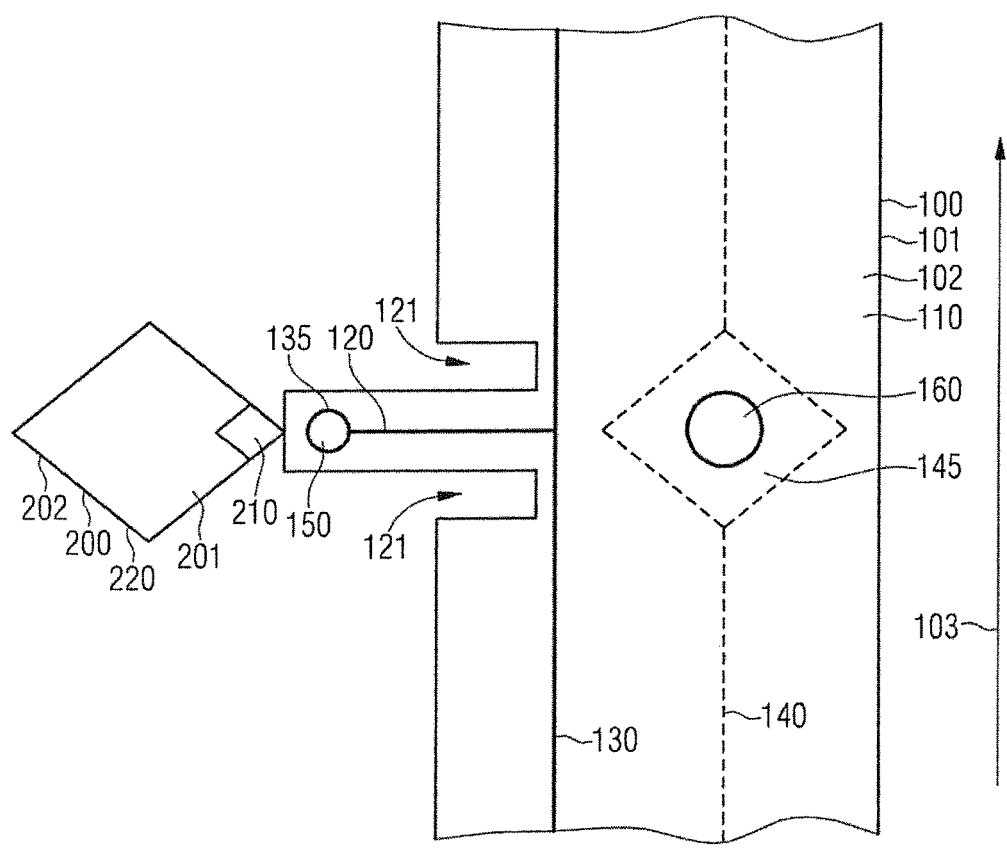
FIG. 1 shows a view of an optoelectronic semiconductor chip and of a carrier strip for the production of an optoelectronic component.

LIST OF REFERENCES 10 optoelectronic component
100 carrier strip
101 upper side
102 lower side
103 longitudinal direction
104 axis
110 band section
120 folding section
121 recess
130 first conductor track
135 first contact region
140 second conductor track
145 second contact region
150 first through-opening
160 second through-opening
200 optoelectronic semiconductor chip
201 front side
202 rear side
210 first electrical connection surface
220 second electrical connection surface
300 first connecting material
310 second connecting material
1100 carrier strip

DETAILED DESCRIPTION

Our optoelectronic component comprises a flexible carrier strip and an optoelectronic semiconductor chip. A first electrical connection surface is configured on a front side of the optoelectronic semiconductor chip and a second electrical connection surface is configured on a rear side of the optoelectronic semiconductor chip. An electrically conductive first contact region and an electrically conductive second contact region are configured on the carrier strip. The first contact region is arranged on a folding section of the carrier strip. The rear side of the optoelectronic semiconductor chip faces toward an upper side of the carrier strip. The upper side of the folding section of the carrier strip faces toward the front side of the optoelectronic semiconductor chip. The first electrical connection surface electrically conductively connects to the first contact region. The second electrical connection surface electrically conductively connects to the second contact region.

Advantageously, in this optoelectronic component, both the first electrical connection surface arranged on the front side of the optoelectronic semiconductor chip and the second electrical connection surface arranged on the rear side of the optoelectronic semiconductor chip connect directly to the flexible carrier strip so that the optoelectronic component has a particularly simple and economical structure. The flexibility of the flexible carrier strip is used to arrange the folding section of the flexible carrier strip engaging around the optoelectronic semiconductor chip.

To produce the optoelectronic component, it is advantageously necessary only to align the first electrical connection surface of the optoelectronic semiconductor chip with the first contact region of the carrier strip. In this way, the relative arrangement between the optoelectronic semiconductor chip and the flexible carrier strip is established with sufficient accuracy so that the connection between the second electrical connection surface of the optoelectronic semiconductor chip and the second contact region of the flexible carrier strip can also be produced. Particularly simple, rapid and economical production of the optoelectronic component is therefore advantageously possible.

The carrier strip may have a first through-opening that lies next to the first contact region in the folding section. In this case, the first through-opening is aligned with the first electrical connection surface. The first electrical connection surface electrically conductively connects to the first contact region by a first connecting material arranged at least partially in the first through-opening. The first connecting material can, for example, be a UV-curing electrically conductive adhesive.

Advantageously, this allows particularly simple fastening of the first contact region of the flexible carrier strip on the front side of the optoelectronic semiconductor chip, by which at the same time an electrically conductive connection between the first contact region and the first electrical connection surface of the optoelectronic semiconductor chip is produced. Advantageously, neither wire-bonding processes nor high-temperature processes are necessary to produce this electrically conductive connection which makes it possible to form the flexible carrier strip from an economical material.

The second electrical connection surface may electrically conductively connect to the second contact region by a second connecting material. In this case, the carrier strip has a second through-opening that lies next to the second contact region. The second connecting material extends through the second contact opening to a lower side of the carrier strip. Advantageously, the second connecting material may simultaneously be used to mechanically fasten the second contact region of the carrier strip on the rear side of the optoelectronic semiconductor chip and produce an electrically conductive connection between the second contact region of the carrier strip and the second electrical connection surface of the optoelectronic semiconductor chip. At the same time, by the second connecting material extending through the second through-opening in the carrier strip, a thermally conductive connection is produced between the rear side of the optoelectronic semiconductor chip and the lower side of the carrier strip, which connection may be used to dissipate waste heat generated in the optoelectronic semiconductor chip during operation of the optoelectronic component.

The second contact region may be arranged on the upper side of the carrier strip. Advantageously, the second contact region therefore faces toward the rear side of the optoelectronic semiconductor chip so that an electrically conductive connection can be produced particularly simply and reliably between the second contact region and the second electrical connection surface of the optoelectronic semiconductor chip.

The first contact region and the second contact region may be arranged on the same side of the carrier strip. Advantageously, the carrier strip can therefore be produced particularly simply and economically.

The carrier strip may have a first conductor track electrically conductively connected to the first contact region. Advantageously, the first conductor track of the carrier strip may be used to apply an electrical voltage to the optoelectronic semiconductor chip of the optoelectronic component. The first conductor track may also be used to electrically connect the optoelectronic semiconductor chip of the optoelectronic component to further optoelectronic semiconductor chips of the optoelectronic component.

The conductor track may extend along a longitudinal direction of the carrier strip. In this case, the folding section is bent about an axis parallel to the longitudinal direction. Advantageously, this leads to a particularly compact example of the optoelectronic component.

The carrier strip may have a second conductor track electrically conductively connected to the second contact region. Advantageously, the second conductor track may be used to electrically connect the optoelectronic semiconductor chip of the optoelectronic component to further optoelectronic semiconductor chips of the optoelectronic component and apply an electrical voltage to the optoelectronic semiconductor chip.

The optoelectronic component may have a further optoelectronic semiconductor chip. In this case, the optoelectronic semiconductor chip and the further optoelectronic semiconductor chip of the optoelectronic component are arranged successively in the longitudinal direction on the carrier strip. It is also possible to configure the optoelectronic component with an even larger number of optoelectronic semiconductor chips arranged successively on the carrier strip. The optoelectronic component therefore has an elongate strip-shaped form that is highly suitable for the purposes of making signs and illumination. The optoelectronic semiconductor chips may be electrically connected in series or electrically connected in parallel on the carrier strip. Advantageously, the optoelectronic component is constructed simply and can be produced economically.

The carrier strip may comprise a film material. The film material may in this case be an economical material since high-temperature processes are advantageously not required for production of the optoelectronic component.

The upper side of the carrier strip may be optically reflective. Advantageously, electromagnetic radiation emitted by the optoelectronic semiconductor chip of the optoelectronic component in the direction toward the upper side of the carrier strip can therefore be reflected on the upper side of the carrier strip and thereby made available for use. A usable brightness of the optoelectronic component is therefore advantageously increased.

Our method of producing an optoelectronic component comprises steps of providing an optoelectronic semiconductor chip having a first electrical connection surface configured on a front side and a second electrical connection surface configured on a rear side, providing a flexible carrier strip having an electrically conductive first contact region and an electrically conductive second contact region, wherein the first contact region is arranged on a folding section of the carrier strip, arranging the optoelectronic semiconductor chip such that the front side of the optoelectronic semiconductor chip faces toward an upper side of the folding section of the carrier strip and the first contact region is aligned with the first electrical connection surface, producing an electrically conductive connection between the first electrical connection surface and the first contact region, and bending the folding section to make the rear side of the optoelectronic semiconductor chip face toward the upper side of the carrier strip and to electrically conductively connect the second electrical connection surface to the second contact region. This method makes it possible to produce an optoelectronic component having compact dimensions.

Both the first electrical connection surface configured on the front side of the optoelectronic semiconductor chip and the second electrical connection surface of the optoelectronic semiconductor chip, configured on the rear side of the optoelectronic semiconductor chip, are in this case electrically contacted by the flexible carrier strip, the flexibility of the carrier strip being exploited. Neither are time- and cost-intensive wire-bonding processes therefore required for production of the optoelectronic component, nor are high-temperature processes, which would make high-temperature stability of the carrier strip necessary, needed for soldering.

In this method, a carrier strip made of an economically obtainable material can therefore advantageously be used. The method advantageously requires only a single step of aligning the first contact region with the first electrical connection surface of the optoelectronic semiconductor chip. This leads to the further relative alignment between the optoelectronic semiconductor chip and the flexible carrier strip with sufficient accuracy so that the method can be carried out particularly simply, rapidly and economically.

The flexible carrier strip may be provided with a first through-opening arranged in a folding section and lies next to the first contact region. In this case, the first through-opening is aligned with the first electrical connection surface. A first connecting material is arranged at least partially in the first through-opening to electrically conductively connect the first electrical connection surface to the first contact region. Advantageously, the first connecting material may in this case, for example, be pressed from the lower side of the carrier strip through the first through-opening to produce the mechanical and electrical connection between the first connection surface of the optoelectronic semiconductor chip and the first contact region of the carrier strip. The method can therefore advantageously be carried out particularly simply and economically.

A UV-curing electrically conductive adhesive may be used as the first connecting material. This makes it possible to cure the adhesive by UV exposure after application on the optoelectronic component that allows simple conduct of the method.

The flexible carrier strip may be provided with a second through-opening that lies next to the second contact region. The second electrical connection surface electrically conductively connects to the second contact region by a second connecting material such that the second connecting material is at least partially pressed through the second through-opening. In this case, the second connecting material may, for example, be arranged on the rear side of the optoelectronic semiconductor chip before bending of the folding section. The second connecting material pressed through the second through-opening then advantageously produces a thermally conductive connection between the rear side of the optoelectronic semiconductor chip and the lower side of the carrier strip, which connection may be used to dissipate waste heat generated in the optoelectronic semiconductor chip from the optoelectronic semiconductor chip during operation of the optoelectronic component which can be obtained by the method.

Advantageously, production of the electrical and mechanical connection between the second electrical connection surface of the optoelectronic semiconductor chip and the second contact region of the carrier strip according to this method does not require particularly accurate alignment of the second contact region and the second electrical connection surface with one another so that the method can be carried out simply and economically.

The first through-opening and/or the second through-opening may be applied by stamping. This advantageously allows simple and economical conduct of the method.

The above-described properties, features and advantages, as well as the way in which they are achieved, will become more clearly and readily comprehensible in conjunction with the following description of examples, which will be explained in more detail in connection with the drawings, in which, respectively, they are schematic representations.

FIG. 1 shows a schematic representation of a carrier strip 100 and an optoelectronic semiconductor chip 200 intended for the production of an optoelectronic component. The optoelectronic component is intended to emit electromagnetic radiation, for example, visible light and may, for example, be used for illumination purposes or for making signs.

The carrier strip 100 is intended to mechanically hold the optoelectronic semiconductor chip 200 and electrically contact the optoelectronic semiconductor chip 200. The carrier strip 100 comprises a thin flexible material, for example, a film material. The carrier strip 100 may, for example, comprise a plastic, for example, a polyester.

The carrier strip 100 has a lower side 102 that can be seen in FIG. 1, and an upper side 101 lying opposite the lower side 102. The carrier strip 100 is configured as an essentially elongate strip that extends in a longitudinal direction 103. Only a longitudinal section of the carrier strip 100 extending in the longitudinal direction 103 is represented in FIG. 1.

The carrier strip 100 comprises a band section 110 and a folding section 120. The band section 110 comprises the main part of the section of the carrier strip 100 as shown in FIG. 1, and is configured as a band extending in the longitudinal direction 103. The band section 110 of the carrier strip 100 may continue on both sides in the longitudinal direction 103 beyond the section shown in FIG. 1.

The folding section 120 is formed by a section of the carrier strip 100 oriented perpendicularly to the longitudinal direction 103. The folding section 120 preferably extends in a direction perpendicular to the longitudinal direction 103 beyond a side edge of the band section 110 of the carrier strip 100. The folding section 120 therefore forms a tab arranged laterally on the band section 110. In addition, in the example of the carrier strip 100 as shown in FIG. 1, the folding section 120 is partially exposed by two recesses 121 of the band section 110 parallel to the folding section 120. This makes it possible to fold the folding section 120 relative to the band section 110 of the carrier strip 100 about an axis parallel to the longitudinal direction 103.

A first conductor track 130 is arranged on the lower side 102 of the carrier strip 100. The first conductor track 130 is electrically conductive and may, for example, comprise a metal. The first conductor track 130 extends along the longitudinal direction 103 in the band section 110 of the carrier strip 100. In the folding section 120 of the carrier strip 100, a first contact region 135 electrically conductively connects to the first conductor track 130, and is configured on the lower side 102 of the carrier strip 100. The first conductor track 130 therefore produces an electrically conductive connection between the first contact region 135 and an outer connection surface or contact pad (not shown in FIG. 1) of the carrier strip 100.

The carrier strip 100 has a first through-opening 150 arranged in the folding section 120 and extends between the upper side 101 and the lower side 102 of the carrier strip 100. The through-opening 150 may, for example, be applied in the carrier strip 100 by a stamping process.

The first contact region 135 on the lower side 102 of the carrier strip 100 lies directly next to the first through-opening 150. In the example represented, the first contact region 135 annularly encloses the through-opening 150 on the lower side 102 of the carrier strip 100. The first contact region 135 may, for example, be configured as a metalization arranged annularly around the first through-opening 150. It is possible initially to form the first contact region 135 in a flat form, for example, as a circular disk-shaped metalization, during production of the carrier strip 100. Subsequently, a part of the first contact region 135 during application of the first through-opening 150.

On the upper side 101 of the carrier strip 100, a second contact region 145 is configured in the band section 110 of the carrier strip 100 and electrically conductively connects to a second conductor track 140 arranged on the upper side 101 of the carrier strip 100. The second conductor track 140 also extends in the longitudinal direction 103 along the band section 110 of the carrier strip 100. The second conductor track 140 produces an electrically conductive connection between the second contact region 145 and a further connection surface or contact pad, that cannot be seen in FIG. 1, of the carrier strip 100. In the example of the carrier strip 100 as represented in FIG. 1, the second contact region 145 has a larger area than the first contact region 135.

In the band section 110, the carrier strip 100 has a second through-opening 160 extending between the upper side 101 and the lower side 102 of the carrier strip 100 and may, for example, be produced by a stamping process. The second through-opening 160 lies next to the second contact region 145. In the example shown in FIG. 1, the second contact region 145 annularly encloses the second through-opening 160. It is possible not to form the second through-opening 160 until after the second contact region 145 is applied.

The optoelectronic semiconductor chip 200 is configured to emit electromagnetic radiation, for example, visible light. The optoelectronic semiconductor chip 200 may, for example, be a light-emitting diode chip (LED chip). The optoelectronic semiconductor chip 200 has a front side 201, which can be seen in FIG. 1, and a rear side 202 lying opposite the front side 201. The front side 201 forms a radiation emission face of the optoelectronic semiconductor chip 200. During operation of the optoelectronic semiconductor chip 200, electromagnetic radiation is emitted at the front side 201 of the optoelectronic semiconductor chip 200.

The optoelectronic semiconductor chip 200 has a first electrical connection surface 210 on its front side 201 and a second electrical connection surface 220 on its rear side 202. By the first electrical connection surface 210 and the second electrical connection surface 220, the optoelectronic semiconductor chip 200 can be supplied with electrical voltage and electrical current to make the optoelectronic semiconductor chip 200 emit electromagnetic radiation. The first electrical connection surface 210 may, for example, be formed in a corner region of the front side 201 of the optoelectronic semiconductor chip 200. The second electrical connection surface 220 may, for example, be formed by the entire rear side 202 of the optoelectronic semiconductor chip 200.

FIG. 2 shows a schematic sectional side view of the carrier strip 100 and of the optoelectronic semiconductor chip 200 in a processing state chronologically following the representation of FIG. 1. In this case, the optoelectronic semiconductor chip 200 and the carrier strip 100 are sectioned in a plane oriented perpendicularly to the longitudinal direction 103 and extending through the folding section 120.

To reach the processing state shown in FIG. 2, starting from the processing state represented in FIG. 1, the optoelectronic semiconductor chip 200 is initially positioned relative to the carrier strip 100 such that the front side 201 of the optoelectronic semiconductor chip 200 faces toward the upper side 101 of the folding section 120 of the carrier strip 100. In this case, the first electrical connection surface 210 configured on the front side 201 of the optoelectronic semiconductor chip 200 is aligned with the first through-opening 150 and with the first contact region 135 of the carrier strip 100. The optoelectronic semiconductor chip 200 and the carrier strip 100 are therefore aligned with one another such that the first electrical connection surface 210 of the optoelectronic semiconductor chip 200 is accessible from the lower side 102 of the carrier strip 100 through the first through-opening 150 of the carrier strip 100.

Subsequently, an electrically conductive connection is produced between the first electrical connection surface 210 of the optoelectronic semiconductor chip 200 and the first contact region 135 of the carrier strip 100. The electrically conductive connection may, for example, be produced by a first connecting material 300 arranged from the lower side 102 of the carrier strip 100 partially on the first contact region 135 on the lower side 102 of the carrier strip 100 and partially in the first through-opening 150 of the carrier strip 100. The first connecting material 300 in this case comes in contact through the first through-opening 150 with the first electrical connection surface 210 and therefore produces an electrically conductive connection between the first electrical connection surface 210 of the optoelectronic semiconductor chip 200 and the first contact region 135 of the carrier strip 100.

The first connecting material 300 may, for example, be a UV-curing electrically conductive adhesive. In this case, the first connecting material 300 may be cured by exposure to UV light after the production of the electrically conductive connection between the first electrical connection surface 210 of the optoelectronic semiconductor chip 200 and the first contact region 135 of the carrier strip 100.

In addition to the electrically conductive connection between the first electrical connection surface 210 and the first contact region 135, the first connecting material 300 also produces a mechanical connection between the optoelectronic semiconductor chip 200 and the folding section 120 of the carrier strip 100.

Subsequently, a second connecting material 310 is arranged on the rear side 202 of the optoelectronic semiconductor chip 200. The second connecting material 310 may, for example, be an electrically conductive adhesive or another connecting material commonly used for the electrically conductive fastening of semiconductor chips (i.e., for the production of chip bond connections). The second connecting material 310 may, for example, be arranged in the form of a paste on the rear side 202 of the optoelectronic semiconductor chip 200. In this case, the second connecting material 310 is arranged on the rear side 202 of the optoelectronic semiconductor chip 200 such that an electrically conductive connection is created between the second electrical connection surface 220 formed on the rear side 202 of the optoelectronic semiconductor chip 200 and the second connecting material 310.

Figure 4:
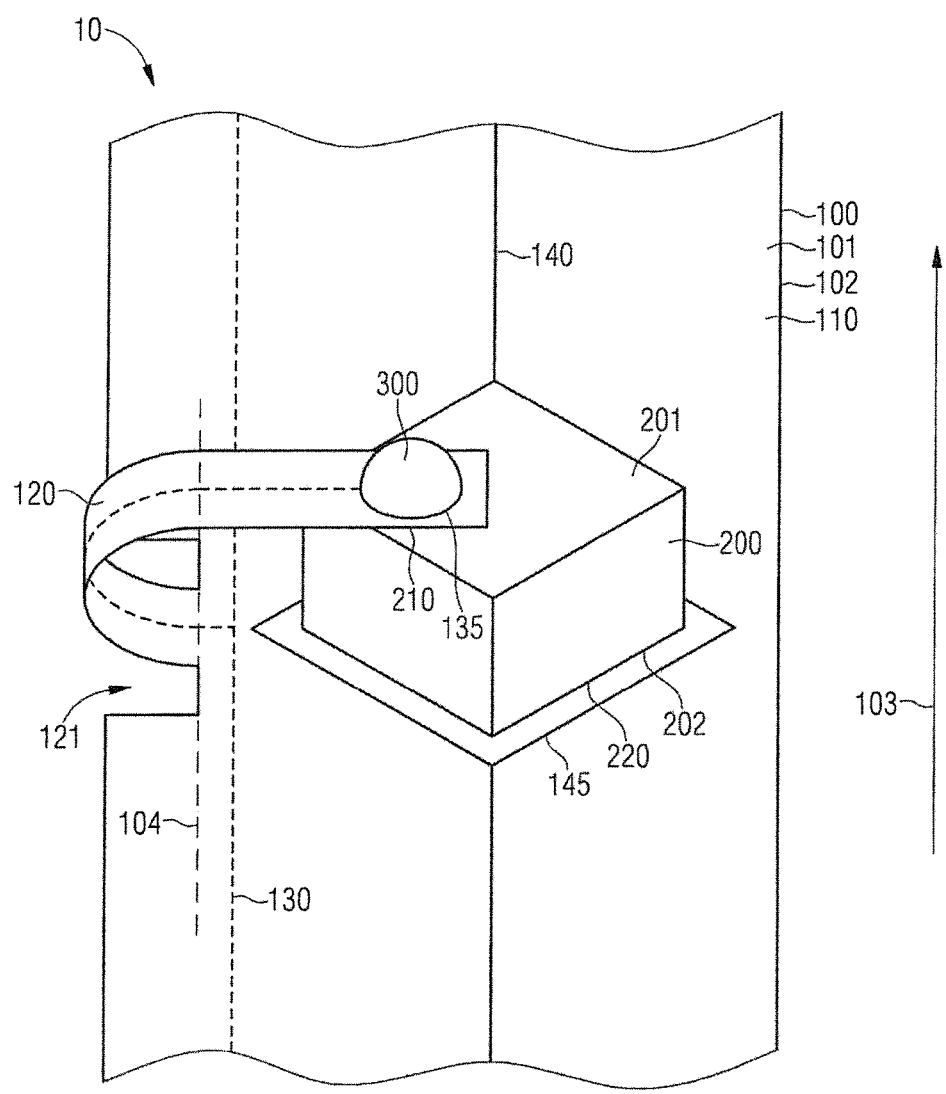
FIG. 4 shows a perspective representation of the optoelectronic component produced from the carrier strip and the optoelectronic semiconductor chip.

The processing state represented in FIG. 2 is therefore reached. FIG. 3 shows a schematic sectional side view of an optoelectronic component 10 formed by further processing steps from the carrier strip 100 and the optoelectronic semiconductor chip 200. FIG. 4 shows a schematic perspective view of a part of the optoelectronic component 10.

Starting from the processing state shown in FIG. 2, the folding section 120 of the carrier strip 100, with the optoelectronic semiconductor chip 200 fastened thereon, is folded about an axis 104 parallel to the longitudinal direction 103 of the carrier strip 100 so that the rear side 202 of the optoelectronic semiconductor chip 200 is moved toward the upper side 101 of the band section 110 of the carrier strip 100. The folding section 120 of the carrier strip 100 is in this case bent around until the rear side 202 of the optoelectronic semiconductor chip 200 bears on the second contact region 145 of the carrier strip 100 on the upper side 101 of the band section 110 of the carrier strip 100. Alternatively, the optoelectronic semiconductor chip 200 and the folding section 120 may also be held in place and the band section 110 of the carrier strip 100 may be moved.

The second connecting material 310 arranged on the rear side 202 of the optoelectronic semiconductor chip 200 produces an electrically conductive connection between the second electrical connection surface 220 formed on the rear side 202 of the optoelectronic semiconductor chip 200 and the second contact region 145 of the carrier strip 100. In this case, the second connecting material 310 is pressed at least partially through the second through-opening 160 of the carrier strip 100 and thereby produces a thermally and electrically conductive connection between the rear side 202 of the optoelectronic semiconductor chip 200 and the lower side 102 of the carrier strip 100. Furthermore, the second connecting material 310 produces a mechanical connection between the rear side 202 of the optoelectronic semiconductor chip 200 and the second contact region 145 on the upper side 101 of the carrier strip 100. The folding section 120 therefore remains in its arrangement bent about the axis 104.

In the optoelectronic component 10, the first electrical connection surface 210 of the optoelectronic semiconductor chip 200 electrically conductively connects by the first connecting material 300 and the first contact region 135 to the first conductor track 130 of the carrier strip 100. The second electrical connection surface 220 of the optoelectronic semiconductor chip 200 electrically conductively connects by the second connecting material 310 and the second contact region 145 to the second conductor track 140 of the carrier strip 100. The optoelectronic semiconductor chip 200 can therefore be supplied with electrical voltage and electrical current by the first conductor track 130 and the second conductor track 140.

The second connecting material 310, arranged at least partially in the second through-opening 160 of the carrier strip 100 and accessible on the lower side 102 of the band section 110 of the carrier strip 100, may be used to couple the optoelectronic semiconductor chip 200 thermally to a heat sink. To this end, the second connecting material 310, arranged in the second through-opening 160, on the lower side 102 of the carrier strip 100 thermally conductively connects to the heat sink. Waste heat generated in the optoelectronic semiconductor chip 200 during operation of the optoelectronic component 10 can then flow away via the rear side 202 of the optoelectronic semiconductor chip 200 and the second connecting material 310 to the heat sink.

The carrier strip 100 of the optoelectronic component 10 may have further folding sections 120 along its longitudinal direction 103, to each of which further first contact regions 135 and further second contact regions 145 are assigned. Further optoelectronic semiconductor chips 200 may be arranged in these longitudinal sections of the carrier strip 100 of the optoelectronic component 10. Preferably, the optoelectronic component 10 therefore has essentially identical sections repeating in the longitudinal direction 103. The optoelectronic semiconductor chips 200 of the optoelectronic component 10 may, for example, be arranged in a series electrical circuit or a parallel electrical circuit.

The upper side 101 of the carrier strip 100 may be configured to be optically reflective. In particular, the upper side 101 of the carrier strip 100 may have a high reflectivity for electromagnetic radiation emitted by the optoelectronic semiconductor chip 200. A usable brightness of the optoelectronic component 10 can therefore be increased.

FIG. 5 shows a schematic sectional side view of the optoelectronic semiconductor chip 200 and a carrier strip 1100. Except for the differences explained below, the carrier strip 1100 corresponds to the carrier strip 100 of FIGS. 1 to 4. Corresponding components are provided with the same references in FIG. 5 as in FIGS. 1 to 4. The carrier strip 1100 shown in FIG. 5 may be used as an alternative to the carrier strip 100.

The carrier strip 1100 differs from the carrier strip 100 in that the first contact region 135 and the first conductor track 130 are arranged on the upper side 101 of the carrier strip 1100. The first contact region 135 in turn lies next to the first through-opening 150 in the folding section 120 of the carrier strip 1100.

The optoelectronic semiconductor chip 200 is arranged on the carrier strip 1100 such that the front side 201 of the optoelectronic semiconductor chip 200 faces toward the upper side 101 of the folding section 120 of the carrier strip 1100. In this case, the first electrical connection surface 210 of the optoelectronic semiconductor chip 200 is aligned with the first through-opening 150 and the first contact region 135 of the carrier strip 1100. Since the first contact region 135 is arranged on the upper side 101 of the carrier strip 1100, there is direct contact between the first electrical connection surface 210 of the optoelectronic semiconductor chip 200 and the first contact region 135 of the carrier strip 1100.

In a processing step following the representation of FIG. 5, the first connecting material 300 may be introduced from the lower side 102 of the carrier strip 1100 into the first through-opening 150 to mechanically and electrically connect the first electrical connection surface 210 to the first contact region 135 of the carrier strip 1100. Alternatively, however, the first connecting material 300 may also already be arranged on the first electrical connection surface 210 of the optoelectronic semiconductor chip 200 and/or on the first contact region 135 of the carrier strip 1100 before the optoelectronic semiconductor chip 200 is arranged on the first contact region 135.

The further processing of the carrier strip 1100 and the optoelectronic semiconductor chip 200 may be carried out in the manner explained with the aid of FIGS. 1 to 4.

In a further alternative configuration of the carrier strip, which is not represented in the figures, the second contact region 145 and the second conductor track 140 may be arranged on the lower side 102 of the carrier strip. The first contact region 135 and the first conductor track 130 may in this case optionally be arranged on the upper side 101 or on the lower side 102 of the carrier strip.

Our components and methods have been illustrated and described in more detail with the aid of the preferred examples. This disclosure is not, however, restricted to the examples disclosed. Rather, other variants may be derived therefrom by those skilled in the art without departing from the protective scope of the appended claims.

This application claims priority of DE 10 2014 110 067.0, the subject matter of which is incorporated herein by reference.

The invention claimed is:

1. An optoelectronic component comprising:
a flexible carrier strip and an optoelectronic semiconductor chip,
wherein a first electrical connection surface is formed on a front side of the optoelectronic semiconductor chip and a second electrical connection surface is formed on a rear side of the optoelectronic semiconductor chip,
an electrically conductive first contact region and an electrically conductive second contact region are formed on the carrier strip,
the first contact region is arranged on a folding section of the carrier strip,
the rear side of the optoelectronic semiconductor chip faces toward an upper side of the carrier strip,
the upper side of the folding section of the carrier strip faces toward the front side of the optoelectronic semiconductor chip,
the first electrical connection surface electrically conductively connects to the first contact region,
the second electrical connection surface electrically conductively connects to the second contact region by a second connecting material,
the carrier strip has a through-opening that lies next to the second contact region, and
the second contacting material extends through the through-opening to a lower side of the carrier strip.

2. The optoelectronic component according to claim 1, wherein the carrier strip has a further through-opening that lies next to the first contact region, in the folding section,
the further through-opening is aligned with the first electrical connection surface, and
the first electrical connection surface electrically conductively connects to the first contact region by a first connecting material arranged at least partially in the further through-opening.

3. The optoelectronic component according to claim 1, wherein the second contact region is arranged on the upper side of the carrier strip.

4. The optoelectronic component according to claim 1, wherein the first contact region and the second contact region are arranged on the same side of the carrier strip.

5. The optoelectronic component according to claim 1, wherein the first contact region is arranged on the lower side of the carrier strip.

6. The optoelectronic component according to claim 1, wherein the first contact region and the second contact region are arranged on opposite sides of the carrier strip.

7. The optoelectronic component according to claim 1, wherein the carrier strip has a first conductor track electrically conductively connected to the first contact region.

8. The optoelectronic component according to claim 7, wherein the first conductor track extends along a longitudinal direction of the carrier strip, and the folding section is bent about an axis parallel to the longitudinal direction.

9. The optoelectronic component according to claim 1, wherein the carrier strip has a second conductor track electrically conductively connected to the second contact region.

10. The optoelectronic component according to claim 1, wherein the optoelectronic component has a further optoelectronic semiconductor chip, and
the optoelectronic semiconductor chip and the further optoelectronic semiconductor chip are arranged successively in the longitudinal direction on the carrier strip.

11. The optoelectronic component according to claim 1, wherein the carrier strip comprises a film material.

12. The optoelectronic component according to claim 1, wherein the upper side of the carrier strip is optically reflective.

13. A method of producing an optoelectronic component comprising:
providing an optoelectronic semiconductor chip having a first electrical connection surface formed on a front side and a second electrical connection surface formed on a rear side;
providing a flexible carrier strip having an electrically conductive first contact region and an electrically conductive second contact region, wherein the first contact region is arranged on a folding section of the carrier strip, and a through-opening of the flexible carrier strip lies next to the second contact region;
arranging the optoelectronic semiconductor chip such that the front side of the optoelectronic semiconductor chip faces toward an upper side of the folding section of the carrier strip and the first contact region is aligned with the first electrical connection surface;
producing an electrically conductive connection between the first electrical connection surface and the first contact region; and
bending the folding section to cause the rear side of the optoelectronic semiconductor chip to face toward the upper side of the carrier strip and electrically conductively connect the second electrical connection surface to the second contact region, wherein the second electrical connection surface electrically conductively connects to the second contact region by a second connecting material such that the second connecting material is at least partially pressed through the second through-opening.

14. The method according to claim 13, wherein the flexible carrier strip is provided with a further through-opening arranged in a folding section and lies next to the first contact region,
the further through-opening is aligned with the first electrical connection surface, and
a first connecting material is arranged at least partially in the first through-opening to electrically conductively connect the first electrical connection surface to the first contact region.

15. The method according to claim 14, wherein a UV-curing electrically conductive adhesive is used as the first connecting material.

16. The method according to claim 14, wherein the further through-opening and/or the second through-opening are applied by stamping.

* * * * *